(12) United States Patent
Derner et al.

(10) Patent No.: US 10,896,717 B2
(45) Date of Patent: Jan. 19, 2021

(54) PSEUDO-NON-VOLATILE MEMORY CELLS

(71) Applicant: Micron Technology, Inc., Boise, ID (US)

(72) Inventors: Scott J. Derner, Boise, ID (US); Christopher J. Kawamura, Boise, ID (US)

(73) Assignee: Micron Technology, Inc., Boise, ID (US)

(*) Notice: Subject to any disclaimer, the term of this patent is extended or adjusted under 35 U.S.C. 154(b) by 217 days.

(21) Appl. No.: 16/235,163

(22) Filed: Dec. 28, 2018

(65) Prior Publication Data

US 2019/0279704 A1 Sep. 12, 2019

Related U.S. Application Data

(60) Provisional application No. 62/641,057, filed on Mar. 9, 2018.

(51) Int. Cl.
*G11C 5/14* (2006.01)
*G11C 11/4074* (2006.01)
*G06F 3/06* (2006.01)

(52) U.S. Cl.
CPC ........ *G11C 11/4074* (2013.01); *G06F 3/0625* (2013.01); *G06F 3/0629* (2013.01); *G06F 3/0673* (2013.01)

(58) Field of Classification Search
CPC . G11C 11/4074; G06F 3/0625; G06F 3/0629; G06F 3/0673

USPC .......................................................... 365/227
See application file for complete search history.

(56) References Cited

U.S. PATENT DOCUMENTS

| | | |
|---|---|---|
| 5,365,487 A | 11/1994 | Patel et al. |
| 6,249,473 B1 | 6/2001 | Lau et al. |
| 6,982,897 B2 | 1/2006 | Luk et al. |
| 7,924,641 B2 | 4/2011 | Yuan et al. |
| 2010/0165704 A1* | 7/2010 | Wu .................. G11C 11/405 365/149 |
| 2012/0226927 A1* | 9/2012 | Kagan .............. G06F 1/3221 713/323 |
| 2019/0043553 A1* | 2/2019 | Chang .............. G11C 11/403 |
| 2019/0311748 A1* | 10/2019 | Rohleder ............ G11C 5/147 |

* cited by examiner

Primary Examiner — Vu A Le
(74) Attorney, Agent, or Firm — Brooks, Cameron & Huebsch, PLLC (57) ABSTRACT

An example apparatus includes an array of memory cells coupled to an array power supply and a controller. The controller may be configured to cause a data value to be stored in at least one memory cell of the array of memory cells while the array of memory cells is operating in a first power state and a determination to be made that a change in a power status to a computing system coupled to the array of memory cells has occurred, wherein the change in the power status of the computing system is characterized by the computing device operating in a reduced power state. Responsive to the determination, the controller may be configured to cause the array power supply to be disabled to operate the array of memory cells in a second power state.

29 Claims, 5 Drawing Sheets

PSEUDO-NON-VOLATILE MEMORY CELLS

PRIORITY INFORMATION

This application claims the benefit of U.S. Provisional Application Ser. No. 62/641,057, filed Mar. 9, 2018, the contents of which are included herein by reference.

TECHNICAL FIELD

The present disclosure relates generally to semiconductor memory and methods, and more particularly, to apparatuses and methods related to pseudo-non-volatile memory cells.

BACKGROUND

Memory devices are typically provided as internal, semiconductor, integrated circuits in computing systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Computing systems often include a number of processing resources (e.g., one or more processors), which may retrieve and execute instructions and store the results of the executed instructions to a suitable location. A processing resource can comprise a number of functional units such as arithmetic logic unit (ALU) circuitry, floating point unit (FPU) circuitry, and a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and division on operands via a number of logical operations.

A number of components in a computing system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and data may also be sequenced and/or buffered.

DETAILED DESCRIPTION

The present disclosure includes apparatuses and methods related to pseudo-non-volatile memory cells. An example apparatus includes an array of memory cells coupled to an array power supply and a controller. The controller may be configured to cause a data value to be stored in at least one memory cell of the array of memory cells while the array of memory cells is operating in a first power state and a determination to be made that a change in a power status to a computing system coupled to the array of memory cells has occurred, wherein the change in the power status of the computing system is characterized by the computing device operating in a reduced power state. Responsive to the determination, the controller may be configured to cause the array power supply to be disabled to operate the array of memory cells in a second power state.

In some memory devices (e.g., DRAM memory devices), some amount of power provided to the memory device may be reduced to reduce power supplied to non-critical data retention circuits during periods of inactivity. For example, in some low power DRAM devices, an amount of power provided to the low power DRAM device may be reduced from non-critical data circuits during periods of inactivity in order reduce an amount of power consumption associated with the DRAM device and, in turn, operation of a computing system in which the DRAM device is operating.

In some approaches, during periods of inactivity in which the amount of power provided to non-critical data retention circuits of the DRAM device is reduced to, the memory array is internally cycled (e.g., refresh operations may be performed) to maintain data stored therein using self and/or auto refresh cycles. Although a power consumption associated with performing refresh operations may be lower than a power consumption associated with operating the DRAM device in a normal power state (e.g., when the DRAM device is receiving full power) or when power supplies coupled to the DRAM are enabled, some threshold amount of power is still consumed in the performance of such refresh operations.

In contrast, embodiments herein are directed to operation of a memory device such as a DRAM memory device in which the power supplied to the memory array associated with the DRAM device is selectively disabled completely during periods of inactivity. This may lead to a further reduction in power consumption in comparison with approaches in which the power to the array and/or DRAM device is merely reduced during periods of inactivity. In addition, embodiments herein may allow the memory array to maintain data stored therein when a power supplied to the memory array is disabled in the absence of performing refresh operations.

For example, embodiments described herein may allow for operation of a memory device in a "pseudo-non-volatile power state." As used herein, a "pseudo-non-volatile power state" is a power state in which power provided to the memory array is disabled while other power supplies associated with the computing system remain enabled and/or are providing a reduced, non-zero amount of power to their respective components. For example, the pseudo-non-volatile power state may be characterized by power to the memory array being disabled while power is still supplied to other components of the computing system such as controllers, hosts, CPUs, etc.

Disabling power supplied to the memory array top operate the memory array in the pseudo-non-volatile power state may include disabling power supplies such as a VCCA power supply configured to provide a voltage to the digit lines of the memory array, VCCP power supply configured to provide power to word lines of the memory array, a VBB power supply configured to provide power to a substrate of the memory array, and/or a DVC2 power supply configured to provide power digit line equilibrate circuitry of the memory array.

Figure 2:
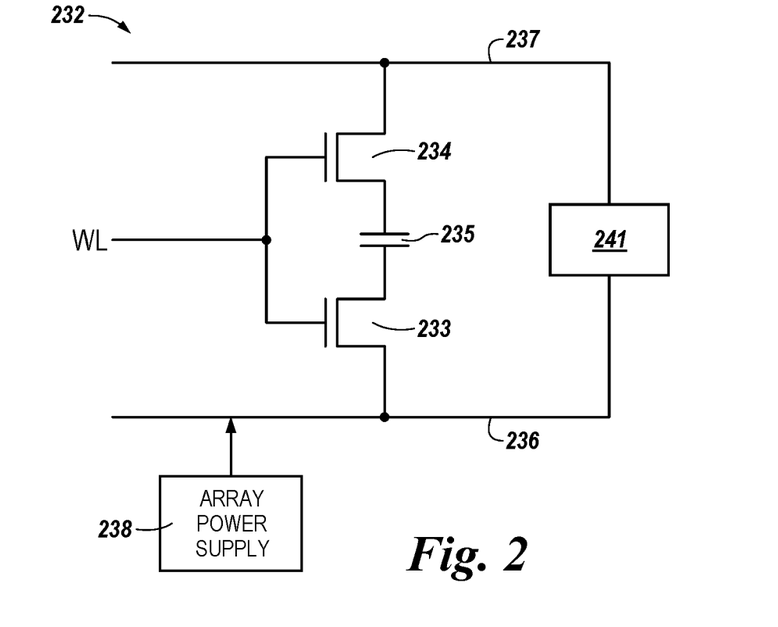
FIG. 2 is a schematic drawing illustrating a memory cell in accordance with a number of embodiments of the present disclosure.

In some embodiments, the memory array may include a plurality of two transistor one capacitor (2T1C) memory cells, as described in further detail herein. In 2T1C memory cell configurations described herein, the capacitor may be coupled at one plate to a source/drain region of one of the transistors and at a second plate to a source/drain region of the other transistor, as illustrated in FIG. 2, herein. In such configurations, the capacitor is not coupled to a cell plate power supply (as opposed to some approaches in which single transistor single capacitor (1T1C) memory cells are utilized in the memory array). In the absence of the cell plate power supply, the memory cell may be configured to maintain one or more data values stored therein in the absence of power being supplied to memory array.

For example, in some 1T1C memory cell configurations, the capacitor is coupled to a cell plate power supply, which may allow for charges associated with the capacitor to drain (e.g., leak or discharge) in the absence of refresh operations being performed on the memory array (or DRAM device). In contrast, the 2T1C memory cell configurations described herein include capacitors that are not coupled to a cell plate power supply. In some embodiments, this may allow for data values stored in the 2T1C memory cell to be maintained in absence of power being supplied to the memory array and/or in the absence of memory refresh operations being performed on the memory array (or DRAM device).

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "n, "N," etc., particularly with respect to reference numerals in the drawings, indicate that a number of the particular feature so designated can be included. As used herein, "a number of" a particular thing refers to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 138 may reference element "38" in FIG. 1, and a similar element may be referenced as 238 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

Figure 1:
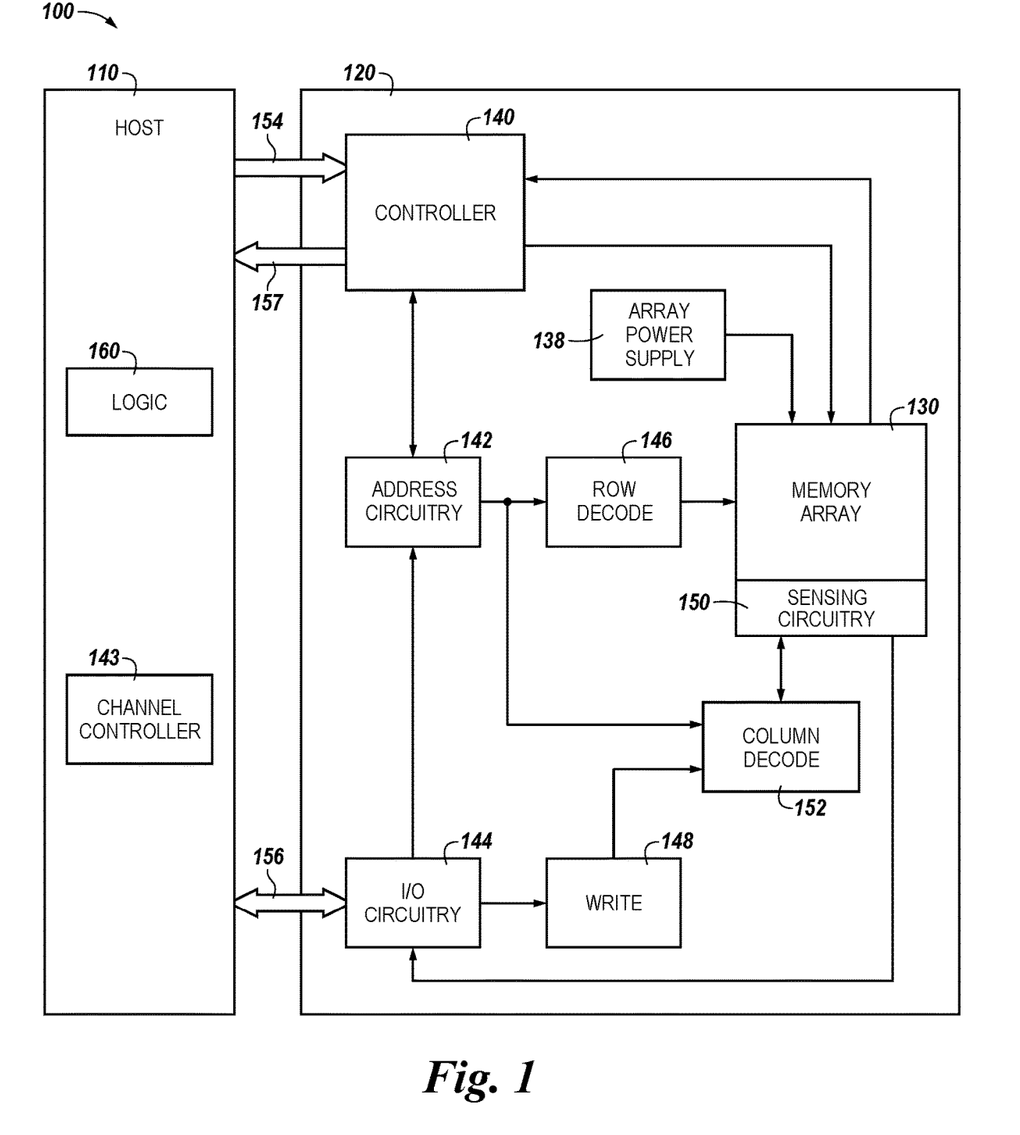
FIG. 1 is a block diagram of an apparatus in the form of a computing system including a memory device in accordance with a number of embodiments of the present disclosure.

FIG. 1 is a block diagram of an apparatus in the form of a computing system 100 including a memory device 120 in accordance with a number of embodiments of the present disclosure. As used herein, a memory device 120, controller 140, channel controller 143, memory array 130, and/or sensing circuitry 150 might also be separately considered an "apparatus."

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array (e.g., a 3T DRAM array), SRAM array, STT RAM array, PCRAM array, TRAM array, RRAM array, NAND flash array, and/or NOR flash array, for instance. The array 130 can comprise memory cells arranged in rows coupled by word lines, which may be referred to herein as access lines or select lines, and columns coupled by digit lines, which may be referred to herein as data lines or sense lines. Although a single array 130 is shown in FIG. 1, embodiments are not so limited. For instance, memory device 120 may include a number of arrays 130 (e.g., a number of banks of DRAM cells, NAND flash cells, etc.). In some embodiments, the memory array may include the sense amplifier 150 in addition to the memory cells arranged in rows coupled by word lines and columns coupled by digit lines.

The memory array 130 may be powered by an array power supply 138, which may be separate and/or distinct from other power supplies of the computing system 100 (which are not shown so as to not obfuscate the Figures). For example, there may be a power supply to provide power to the controller 140, a power supply to provide power to the host 110, a power supply to provide power to the entire computing system 100, etc. However, the array power supply 138 may be controllable separately from these and other power supplies of the computing system.

The memory device 120 includes address circuitry 142 to latch address signals for data provided over a data bus 156 (e.g., an I/O bus) through I/O circuitry 144. Status and/or exception information can be provided from the controller 140 on the memory device 120 to a channel controller 143, through a high speed interface (HSI) including an out-of-band bus 157, which in turn can be provided from the channel controller 143 to the host 110. Address signals are received through address circuitry 142 and decoded by a row decoder 146 and a column decoder 152 to access the memory array 130. Data can be read from memory array 130 by sensing voltage and/or current changes on the digit lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 can be used to write data to the memory array 130.

Controller 140 (e.g., memory controller) decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110 and sequencing access to the array 130. The controller 140 can be a state machine, sequencer, or some other type of controller, and include hardware and/or firmware (e.g., microcode instructions) in the form of an application specific integrated circuit (ASIC), field programmable gate array, etc. The controller 140 can control, for example, performance of logical operations between operands stored in the memory array 130.

As described further below, in a number of embodiments, the sensing circuitry 150 and/or the array 130 can comprise a sense amplifier. The sense amplifier may also be referred to herein as an accumulator, and can be used in the performance of logical operations.

In a number of embodiments, the sensing circuitry 150 can be used to perform logical operations using data stored in array 130 as inputs and/or store the results of the logical operations back to the array 130 without transferring data via a digit line address access (e.g., without firing a column decode signal). As such, various compute functions can be performed using, and within, sensing circuitry 150 rather than (or in association with) being performed by processing resources external to the sensing circuitry (e.g., by a processing resource associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling an I/O line (e.g., a local I/O line) coupled to the sensing circuitry 150. The sensing circuitry 150 can be formed on pitch with the memory cells of the array.

In a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth consumption of such an external processing resource).

However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to performing logical operations using sensing circuitry (e.g., 150) without enabling column decode lines of the array. Whether or not local I/O lines are used in association with performing logical operations via sensing circuitry 150, the local I/O line(s) may be enabled in order to transfer a result to a suitable location other than back to the array 130 (e.g., to an external register).

FIG. 2 is a schematic drawing illustrating a memory cell 232 in accordance with a number of embodiments of the present disclosure. The memory cell 232 may be one of a plurality of memory cells that are part of a memory array such as memory array 130 illustrated in FIG. 1. For example, the memory cell 232 can be one of a number of memory cells corresponding to memory array 130 shown in FIG. 1. In the example shown in FIG. 2, the memory cell 232 is a two transistor, one capacitor (2T1C) memory cell. That is, as shown in FIG. 2, the memory cell 232 includes a first transistor 233, a second transistor 234, and a single capacitor 235. The 2T1C memory cell may correspond to a memory cell among a plurality of memory cells included in a DRAM memory array.

The first transistor 233 may be coupled at a first source/drain region to a first complementary digit line 236 (e.g., a first complementary bit line) and coupled at a second drain/source region to a first region (e.g., a first plate) of the capacitor 235. A gate region of the first transistor 233 may be coupled to a word line (WL).

The second transistor 234 may be coupled at a first source/drain region to a second complementary digit line 237 (e.g., a second complementary bit line) and coupled at a second drain/source region to a second region (e.g., a second plate) of the capacitor 235. A gate region of the first transistor 234 may be coupled to a word line (WL).

The first complementary digit line 236 and the second complementary digit line 237 may be coupled to circuitry 241. The circuitry 241 may be circuitry configured to determine a state of the memory cell 232. For example, the circuitry 241 may be a sense amplifier configured to determine a differential amount of power (e.g., a voltage) on the first digit line 236 and/or the second digit line 237 that represents a data value stored in the memory cell 232, and amplify the differential amount of power to obtain a data value that may be stored in the memory cell and/or transferred to a location outside the memory cell 232.

In contrast to some approaches, it is noted that, in the memory cell 232 illustrated in FIG. 2, the capacitor 235 is coupled only to source/drain regions of the respective transistors 233 and 234. For example, the capacitor 235 is not coupled to a cell plate power supply. As a result, in some embodiments, a charge stored in the capacitor 235 may not drain (e.g., may not leak, discharge, or dissipate) through a cell plate power supply. For example, in some embodiments, a charge stored in the capacitor 235 may be maintained when the array power supply 238 is disabled.

As described above, the memory cell 232 may correspond to one memory cell of a plurality of memory cells of a memory array (e.g., memory array 130 illustrated in FIG. 1). The memory array (and corresponding memory cells associated therewith) may be coupled to an array power supply 238. The array power supply 238 may include one or more power supplies such as a VCCA power supply configured to provide a voltage to the digit lines of the memory array, a VCCP power supply configured to provide power to word lines of the memory array, a VBB power supply configured to provide power to a substrate of the memory array, and/or a DVC2 power supply configured to provide power digit line equilibrate circuitry of the memory array are disabled.

In some embodiments, the array power supply 238 may be configured to provide power to the memory array and may therefore be separate and/or distinct from other power supplies of a computing system such as computing system 100 illustrated in FIG. 1. For example, there may be a power supply to provide power to the controller (e.g., controller 140 illustrated in FIG. 1), a power supply to provide power to the host (e.g., host 110 illustrated in FIG. 1), a power supply to provide power to the entire computing system (e.g., computing system 100 illustrated in FIG. 1), etc., all of which may be separate and/or distinct from the array power supply 238.

In some embodiments, the array power supply 238 may be configured to provide a first amount of power to the memory array when the computing system is operating in a first power state, and a second amount of power to the memory array when the computing system is operating in a second power state. In some embodiments, the first power state may correspond to a power state in which the array power supply 238 is enabled, and the second power state may correspond to a power state in which the array power supply 238 is disabled. As described in more detail in connection with FIGS. 5 and 6, herein, the array power supply 238 may be configured to be disabled (e.g., to provide no power to the memory array) when operated in a particular power state, such as a pseudo-non-volatile power state. Conversely, the array power supply 238 may be configured to be enabled (e.g., to provide power to the memory array) when operated in another particular power state such a power state corresponding to a normal mode of operation.

Figure 3:
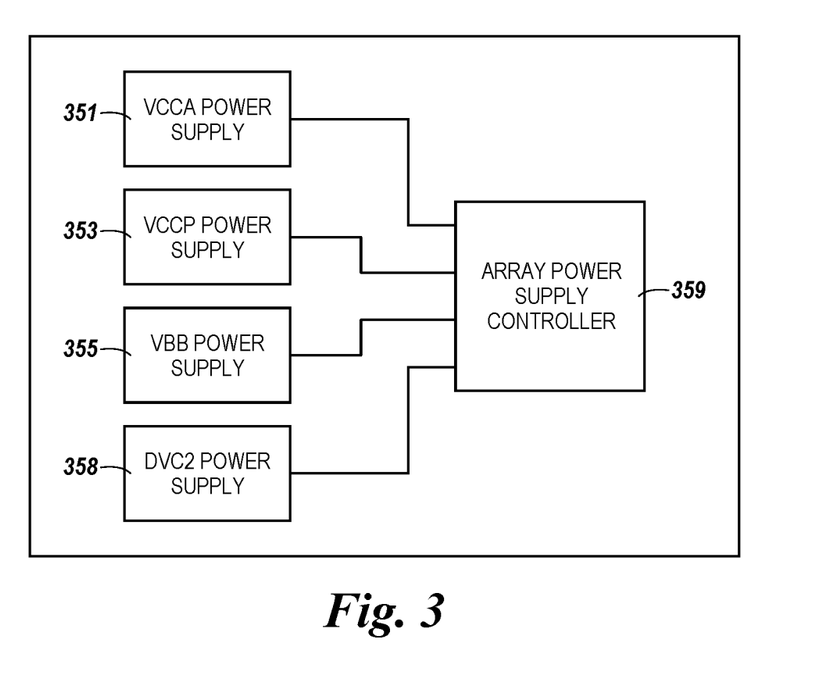
FIG. 3 is a block diagram of an array power supply in accordance with a number of embodiments of the present disclosure.

FIG. 3 is a block diagram of an array power supply in accordance with a number of embodiments of the present disclosure. The array power supply 338 shown in FIG. 3 may include a VCCA power supply 351, a VCCP power supply 353, a VBB power supply 355, a DVC2 power supply 358, and an array power supply controller 359. Although shown in a single box in FIG. 3, the components of the array power supply 338 may be located in different configurations and/or on one or more integrated circuits. In some embodiments, the array power supply 338 may include or more integrated circuits and may be provided as an application specific integrated circuit, system-on-s-chip, floating point gate array, or other suitable circuit or circuits.

The VCCA power supply 351 may be configured to provide a voltage to the digit lines (e.g., digit lines 236 and 237 illustrated in FIG. 2) of the memory array (e.g., memory array 130 illustrated in FIG. 1). The VCCA power supply 351 may include a plurality of transistors and/or other circuit components to provide the voltage to the digit lines.

The VCCP power supply 353 may be configured to provide a voltage to word lines (e.g., WL illustrated in FIG. 2) of the memory array. In some embodiments, when the VCCP power supply 353 is enabled, it may be configured to increase a received voltage such that the received voltage is above a threshold voltage level and apply the increased voltage to the word line during operation of the memory cell (e.g., memory cell 232 illustrated in FIG. 2) and/or during operation of the memory array. The VCCP power supply 353 may include a plurality of transistors (e.g., NMOS transistors) and/or other circuit components to increase the received voltage prior to applying the increased voltage to the word line.

The VBB power supply 355 may be configured to provide a voltage to a substrate of the memory array. When enabled, the VBB power supply 355 may be configured to apply a negative bias voltage to the substrate of the memory array during operation of the memory cell and/or during operation of the memory array. The VBB power supply 355 may include a plurality of transistors (e.g., PMOS transistors) and/or other circuit components to apply the negative bias voltage to the substrate of the memory array.

The DVC2 power supply 358 may be configured to provide power to digit line equilibrate circuitry of the memory array. The DVC2 power supply 358 may include a plurality of transistors and/or other circuit components to provide power to the digit line equilibrate circuitry of the memory array. In some embodiments, the digit line equilibration circuitry may be configured to equilibrate the digit lines in association with preparing for a sensing operation using, for example circuitry 241 illustrated in FIG. 2.

The array power supply controller 359 may be configured to control operation of the VCCA power supply 351, the VCCP power supply 353, the VBB power supply 355, and/or the DVC2 power supply 358. For example, the array power supply controller may be configured to selectively disable and/or enable one or more of the components of the array power supply 338 (e.g., the VCCA power supply 351, the VCCP power supply 353, the VBB power supply 355, and/or the DVC2 power supply 358).

For example, the array power supply controller 359 may be configured to selectively disable and/or enable the array power to supply 338 power supplied to the array in response to a determination that a threshold period of inactivity has occurred, a threshold amount of power has been consumed during operation of the computing system, etc. Embodiments are not so limited; however, and the array power supply controller 359 may be configured to selectively disable and/or enable the array power supply 338 based on a user input (e.g., a signal input by a user of the computing system) commanding the array power supply 338 to be disabled or enabled, among other suitable inputs.

In some embodiments, when one or more of the components of the array power supply 338 are selectively disabled, power may be selectively disabled to the memory array. Selectively disabling power supplied to the memory array may reduce an amount of power consumed by the computing system, which may lead to cost savings in terms of energy, may prolong the life of the computing system, and/or may increase battery life in computing systems that operate on battery power.

As described in more detail in connection with FIGS. 2, 5, and 6, herein, memory cells of the memory array may be configured to maintain a data value stored therein when the array power supply 338 is disabled. For example, memory cells of the memory array may be configured to store a data value after the array power supply 338 has been disabled in the absence of memory refresh operations and/or in the absence of an amount of power being supplied to the memory array.

Figure 4:
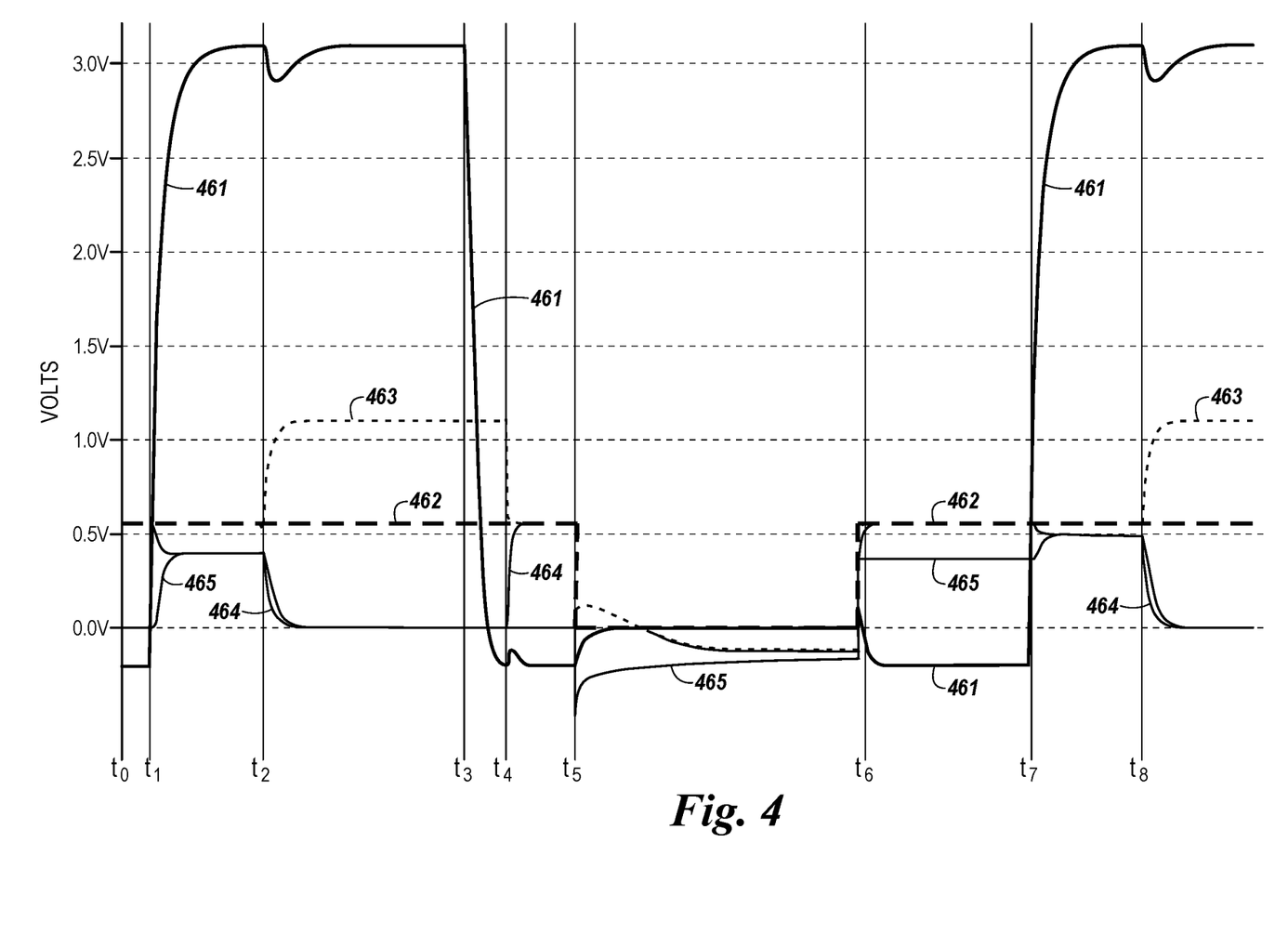
FIG. 4 is a timing diagram illustrating voltage as a function of time for a previous approach to disabling power supplied to a memory array.

FIG. 4 is a timing diagram illustrating voltage as a function of time for a previous approach to disabling power supplied to a memory array. The timing diagram shown in FIG. 5 may correspond to voltages as a function of time associated with a two transistor, one capacitor (2T1C) memory cell. In FIG. 4, the curve 461 represents a voltage associated with a word line, the curve 462 represents a voltage associated with a shared cell plate (e.g., a shared cell plate of the capacitor in a 1T1C memory cell), the curve 463 represents a voltage associated with a first digit line (e.g., a reference digit line), the curve 464 represents a voltage associated with a second digit line (e.g., an active digit line), and the curve 465 represents a voltage associated with a cell storage node (e.g., a storage location associated with the 1T1C memory cell).

At time $t_0$, the memory cell is in a precharge state in which no memory cell operation is in progress. The capacitor (e.g., a cell storage node) is at a ground reference potential, as indicated by the curve 465. The shared cell plate is at $V_{cc}/2$, as indicated by the curve 462, and the digit lines are precharged to $+/-V_{cc}/2$, as indicated by the curves 463 and 464.

At time $t_1$, the word line may be activated as indicated by the increase in voltage on the curve 461 shown at time $t_1$. Charge sharing may occur between the cell storage node and the active digit line as indicated by the increase in voltage illustrated by the curve 465 and the decrease in voltage indicated by the curve 464. During this time, the reference digit line remains at $V_{cc}/2$, as indicated by the curve 463.

At time $t_2$, a sense amplifier associated with the memory cell may be enabled. When the sense amplifier is enabled, the voltages on the reference digit line and the active digit line separate and go to the voltages associated with the power rails depending on the data value read by the memory cell. In the example shown in FIG. 4, the voltage on the active digit line increases, as indicated by the curve 463 to represent a logical value of "1," while the voltage on the reference digit line decrease to zero volts, as indicated by the curve 464. In some embodiments, the full cell voltage associated with the array may be restored as indicated by the increase in the curve 464. Subsequently, at time $t_3$, the word line is disabled as indicated by the decrease in the curve 461.

At time $t_4$, the sense amplifier is disabled. As shown in FIG. 4, the digit lines (e.g., the reference digit line and the active digit line) are precharged to $V_{cc}/2$ again, as indicated by the decrease in the curve 463 and corresponding increase in the curve 464.

At time $t_5$, power supplied to the memory array is disabled. For example, power supplies such as a VCCA power supply configured to provide a voltage to the digit lines of the memory array, VCCP power supply configured to provide power to word lines of the memory array, a VBB power supply configured to provide power to a substrate of the memory array, and/or a DVC2 power supply configured to provide power digit line equilibrate circuitry of the memory array are disabled. When the power supplies associated with the memory array are disabled, other power supplies corresponding to the computing system may remain active, or one or more power supplies associated with the computing system may be configured to operate in a reduced power state such as a standby state or sleep state.

When the power supplied to the memory array is disabled, the voltage associated with the cell plate goes to a ground reference potential, as indicated by the curve 462. At $t_6$, the voltage associated with the cell storage node are set to the ground reference potential and attempt to follow the voltage change on the word line and/or the voltage change on the cell plate, which drives the voltage on the cell storage node to a negative potential (e.g., a potential below the ground reference potential), as indicated by the curve 465. Subsequently, the voltage associated with the cell storage node begins to drift upward as the charge associated therewith leaks through the transistor of the 1T1C memory cell. This may be a result of the capacitor charge may drain (e.g., dissipate or leak) through a cell plate power supply coupled to the capacitor.

At time $t_6$, power supplied to the array is re-enabled and the memory device is in a precharged state. The cell storage node (which should store a "0" from being driven to the ground reference potential at time $t_5$) is no longer at the ground reference potential and is instead above the ground reference potential, as indicated by the curve 465. This phenomenon corresponds to a loss of charge in the cell storage node which dissipated as a result of the power supplied to the array being disabled.

At time $t_7$, the word line may be activated as indicated by the increase in voltage on the curve 461 shown at time $t_7$. Charge sharing may occur between the cell storage node and the active digit line as indicated by the increase in voltage illustrated by the curve 465 and the decrease in voltage indicated by the curve 464. During this time, the reference digit line remains at $V_{cc}/2$, as indicated by the curve 463. However, it is noted that the voltage associated with the cell storage node is lower at time $t_7$ than the voltage associated with the cell storage node at time $t_1$.

At time $t_8$, the sense amplifier associated with the memory cell may be enabled. When the sense amplifier is enabled, the voltages on the reference digit line and the active digit line separate and go to the voltages associated with the power rails depending on the data value read by the memory cell. In the example shown in FIG. 4, the voltage on the active digit line increases, as indicated by the curve 463 to represent a logical value of "1," while the voltage on the reference digit line decrease to zero volts, as indicated by the curve 464. In some embodiments, the full cell voltage associated with the array may be restored as indicated by the increase in the curve 464.

Figure 5:
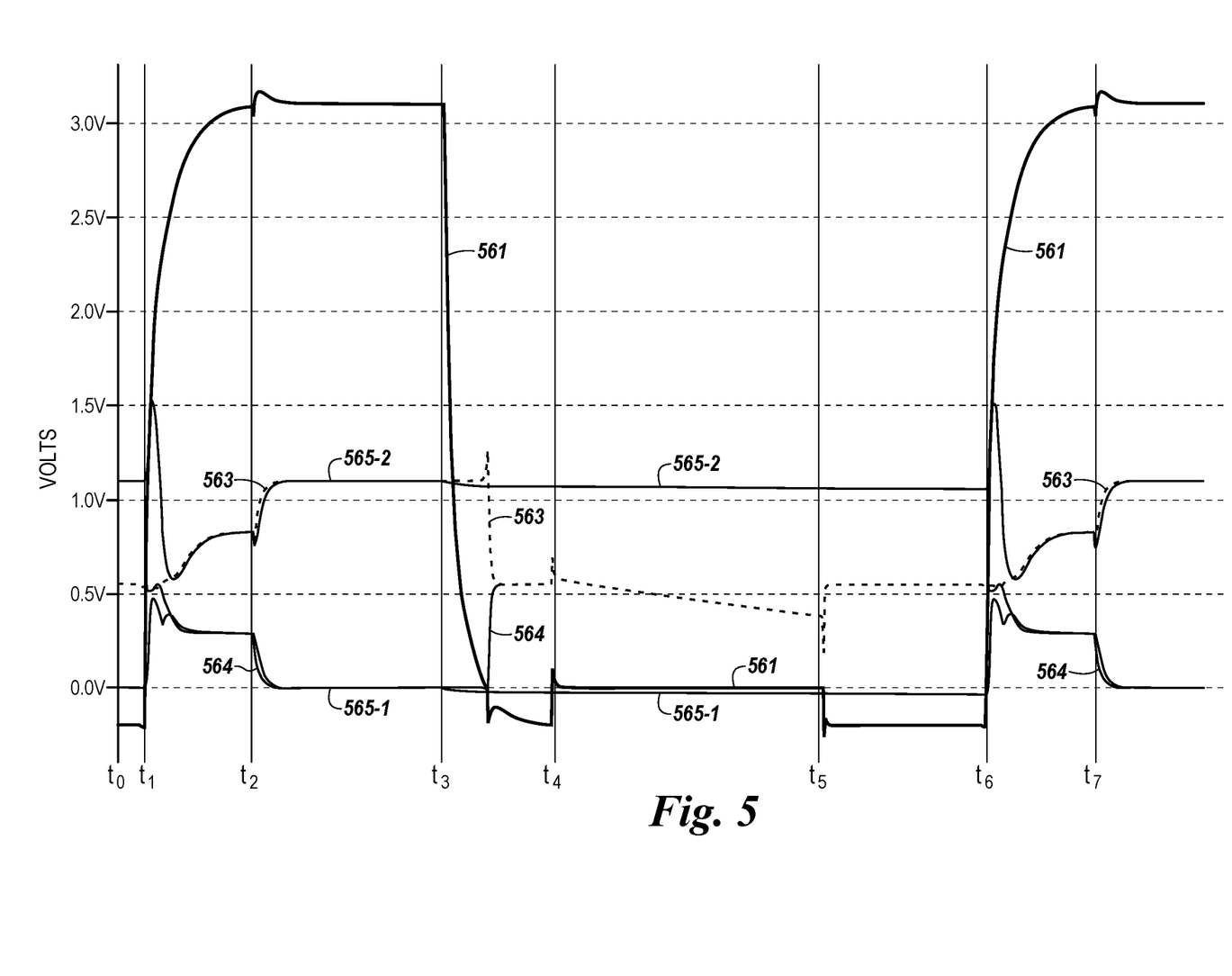
FIG. 5 is a timing diagram illustrating voltage as a function of time for disabling a power supplied to a memory array in accordance with a number of embodiments of the present disclosure.

FIG. 5 is a timing diagram illustrating voltage as a function of time for disabling a power supplied to a memory array in accordance with a number of embodiments of the present disclosure. The timing diagram shown in FIG. 5 may correspond to voltages as a function of time for a 1T1C memory cell. In FIG. 5, the curve 561 represents a voltage associated with a word line (e.g., WL illustrated in FIG. 2), the curve 563 represents a voltage associated with a first digit line (e.g., a reference digit line such as digit line 236 or digit line 237 illustrated in FIG. 2), the curve 564 represents a voltage associated with a second digit line (e.g., an active digit line such as digit line 236 or digit line 237 illustrated in FIG. 2), and the curves 565-1 and 565-2 represent voltages associated with a first cell storage node and a second cell storage node (e.g., a storage location associated with the 2T1C memory cell).

At time $t_0$, the memory cell (e.g., memory cell 232 illustrated in FIG. 2) is in a precharged state. The cell storage node (e.g., capacitor 235 illustrated in FIG. 2) is at a ground reference potential, as indicated by the curve 565-1 and the other side of the cell plate is at $V_{cc}$, as indicated by the curve 565-2. The digit lines are precharged to $+/-V_{cc}/2$, as indicated by the curves 563 and 564. In contrast to the 1T1C example shown in FIG. 4, there is not shared cell plate in the example of FIG. 5, (e.g, the capacitor associated with 2T1C memory cell described in FIG. 5 is not coupled to a common reference potential).

At time $t_1$, the word line (e.g., WL illustrated in FIG. 2) is enabled, as indicated by the increase in voltage of the curve 561. Charge sharing may occur between a first plate of the cell storage node and the active digit line as indicated by the increase in voltage illustrated by the curve 565-1 and the decrease in voltage indicated by the curve 564. Charge sharing may also occur between the reference digit line and a second plate of the cell storage node, as indicated by the increase in the voltage of the curve 565-2 and corresponding increase in the voltage of the curve 563. This creates a large voltage differential (e.g., signal) between the reference digit line and the active digit line.

At time $t_2$, the sense amplifier (e.g., circuitry 241 illustrated in FIG. 2) is enabled. When the sense amplifier is enabled, the voltages on the reference digit line and the active digit line separate and go to the voltages associated with the power rails depending on the data value read by the memory cell. In the example shown in FIG. 5, the voltage on the active digit line increases, as indicated by the curve 563 to represent a logical value of "1," while the voltage on the reference digit line decrease to zero volts, as indicated by the curve 564. In some embodiments, the full cell voltage associated with the array may be restored at time $t_2$.

At time $t_3$, the word line is disabled as indicated by the decrease in the curve 561. The sense amplifier is also disabled at time $t_3$, and the digit lines (e.g., the active digit line and the reference digit line) are precharged to $V_{cc}/2$, as indicated by the curves 564 and 563, respectively.

At time $t_4$, power supplied to the memory array is disabled. For example, the array power supply (e.g., array power supply 238 illustrated in FIG. 2/array power supply 338 illustrated in FIG. 3) may be disabled. Disabling the power supplied to the memory array may include disabling power supplies such as a VCCA power supply configured to provide a voltage to the digit lines of the memory array, a VCCP power supply configured to provide power to word lines of the memory array, a VBB power supply configured to provide power to a substrate of the memory array, and/or a DVC2 power supply configured to provide power digit line equilibrate circuitry of the memory. When the power supplies associated with the memory array are disabled, other power supplies corresponding to the computing system may remain active, or one or more power supplies associated with the computing system may be configured to operate in a reduced power state. In some embodiments, disabling the power supplied to the array may include driving that array voltage from $V_{cc}$ to a ground reference potential.

In addition, at time $t_4$, a voltage associated with the word line may be set to the ground reference potential. As shown in FIG. 5, in contrast to the 1T1C memory cell described in connection with FIG. 4, there is substantially no leakage through the transistors (e.g., transistor 233 and/or transistor 234 illustrated in FIG. 2) because there is no shared cell plate in the 2T1C configuration discussed in FIG. 5. As a result, a data value stored in the memory cell prior to disabling the array power supply may be maintained when the array power supply is disabled. Although there is a minimal amount of voltage lost on the digit lines (e.g., the reference digit line and the active digit line), as indicated by the curves 563 and 564, respectively, over the time period between time $t_4$ and time $t_5$, the cell storage nodes remain unaffected during the time when the power supplied to the array is disabled, as indicated by the substantially flat behavior of the curves 565-1 and 565-2.

At time $t_5$, power supplied to the array is re-enabled and the memory device is in a precharged state. In contrast with the 2T1C memory cell described in connection with FIG. 4, cell voltages remain substantially the same as they were prior to the power supplied to the array being disabled, as indicated by the curves 565-1 and 565-2.

At time $t_6$, the word line (e.g., WL illustrated in FIG. 2) is enabled, as indicated by the increase in voltage of the curve 561. Charge sharing may occur between a first plate of the cell storage node and the active digit line as indicated by the increase in voltage illustrated by the curve 565-1 and the decrease in voltage indicated by the curve 564. Charge sharing may also occur between the reference digit line and a second plate of the cell storage node, as indicated by the increase in the voltage of the curve 565-2 and corresponding increase in the voltage of the curve 563. This creates a large voltage differential (e.g., signal) between the reference digit line and the active digit line. Although the signal level after the power supplied to the array is re-enabled is lower than the initial signal level at time $t_1$, the difference in signal level is substantially reduced in comparison with the behavior of the 2T1C memory cell described in connection with FIG. 4.

At time $t_7$, the sense amplifier is enabled. When the sense amplifier is enabled, the voltages on the reference digit line and the active digit line separate and go to the voltages associated with the power rails depending on the data value read by the memory cell. In the example shown in FIG. 5, the voltage on the active digit line increases, as indicated by the curve 563 to represent a logical value of "1," while the voltage on the reference digit line decrease to zero volts, as indicated by the curve 564. In some embodiments, the full cell voltage associated with the array may be restored at time $t_2$, and a data value that was stored in the memory cell prior to disabling the power supplied to the memory cell may be correctly read.

Figure 6:
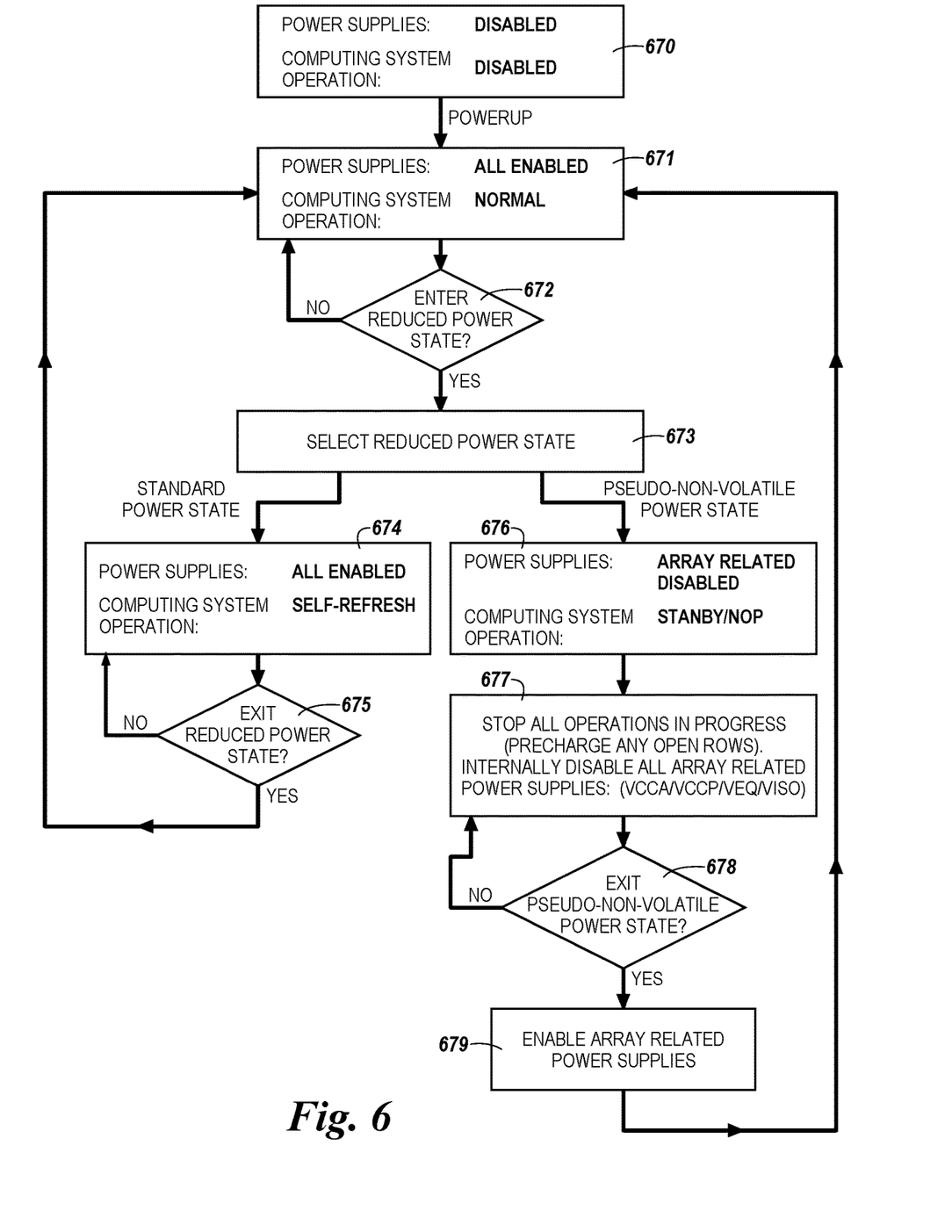
FIG. 6 is a flow diagram for operating a computing system in accordance with a number of embodiments of the present disclosure.

FIG. 6 is a flow diagram for operating a computing system in accordance with a number of embodiments of the present disclosure. At block 670, power supplies coupled to a computing system (e.g., computing system 100 illustrated in FIG. 1) may be in a disabled (e.g., off) state and the host (e.g., host 110 illustrated in FIG. 1) and/or memory array (e.g., memory array 130 illustrated in FIG. 1) may be powered down. For example, the array power supply (e.g., array power supply 238 illustrated in FIG. 2) may be powered down, as well as a main power supply associated with the computing system, power supplies associated with the host, controller, and/or other components of the computing system. Subsequently, a powerup (e.g., boot) operation may be performed to initiate the computing system. At block 671, all power supplies (e.g., main power, host power supplies, controller power supplies, array power supplies, etc.) associated with the computing system may be enabled and the computing system (and its components, such as the host, controllers, memory array, etc.) may be in a normal state of operation. For example, once the power supplies associated with the computing system are enabled at block 671, the computing system may be operating in a S0 working state.

At block 672, a determination as to whether to enter a reduced power state may occur. For example, a determination as to whether the computing system is to enter a reduced power state may occur. If it is determined that the computing system is not to enter the reduced power state, all power supplies associated with the computing system may be remain enabled and the computing system may be in a normal state of operation as shown at block 671. If it is determined that the computing system is to enter the reduced power state, a particular reduced power state may be chosen at block 673.

For example, as shown at block 673, a reduced power state (e.g., a standby-mode) for the computing system may be selected. In some embodiments, the reduced power state may be a standby-mode for the computing system. For example, the reduced power state may be a standard power state as shown at block 674, or the reduced power state may be a pseudo-non-volatile power state as shown at block 676. The determination may occur in response to an input such as an input from a user, an amount of time that has elapsed since the computing system has received and/or processed a command (e.g., after a threshold time period in which the computing system has not received an input has expired or a period of inactivity), or other suitable methods of determining whether the computing system should enter the standard reduced power state or the pseudo-non-volatile power state.

If a standard reduced power state is selected, the computing system may enter a standard reduced power state mode of operation. In the standard reduced power state, all power supplies associated with the computing system may be enabled, and the computing system may perform self or auto-refresh operations, such as memory refresh operations, for example. In some embodiments, the standard reduced power state shown at block 674 may be a "modern standby" sleep power state such as a S0 low-power idle state, a sleep state such as a S1-S3 sleep power state, or a hibernate S4 power state. While in the standard reduced power state, power is supplied to the memory array via the array power supply (e.g., array power supply 138 illustrated in FIG. 1).

At block 675, a determination as to whether to exit the standard reduced power state may be made. If it determined that the computing system is to remain in the standard reduced power state, the computing system stays in the standard reduced power state shown at block 674. If, however, it is determined that the computing system is to exit the standard reduced power state at block 675, all power supplies of the computing system may be enabled, and the computing system may operate in a normal mode of operation again as shown at block 671.

At block 676, a determination may be made that the computing system is to enter a pseudo-non-volatile power state. As used herein, a "pseudo-non-volatile power state" is a power state in which power provided to the memory array is disabled while other power supplies associated with the computing system remain enabled and/or are providing a reduced, non-zero amount of power to their respective components. For example, the pseudo-non-volatile power state may be characterized by power to the memory array being disabled while power is still supplied to other components of the computing system. In the pseudo-non-volatile power state, as shown at block 676, the power supplies associated with powering the memory array are disabled, and the computing system is operating in a reduced power state such as the standby-mode(s) described in connection with block 674. In some embodiments, this may allow for reduced overall power consumption of the computing system because the power supplied to the memory array is disabled.

In some embodiments, disabling power supplied to the memory array may include power supplies such as a VCCA power supply configured to provide a voltage to the digit lines of the memory array, VCCP power supply configured to provide power to word lines of the memory array, a VBB power supply configured to provide power to a substrate of the memory array, and/or a DVC2 power supply configured to provide power digit line equilibrate circuitry of the memory array.

In some embodiments, while operating in the pseudo-non-volatile power state, memory cells of the memory array may be configured to maintain data values stored therein prior to disabling the power supplied to the memory array. For example, because the capacitor 235 of the memory cell 232 illustrated in FIG. 2 is not connected to a cell plate power supply, the memory cell may store a data value contained therein in the absence of power being supplied to the memory array, as described in connection with FIG. 4, herein.

While the computing system is operating in the pseudo-non-volatile power state, at block 677, memory operations in progress may be stopped or paused. In some embodiments, stopping, pausing, and/or aborting memory operations in progress may include stopping, pausing, and/or aborting refresh operations associated with the memory array. For example, memory cells of the memory array may be configured to maintain data values stored therein in the absence of performance of self or auto-refresh operations.

At block 678, a determination as to whether to exit the pseudo-non-volatile power state may occur. If it is determined not to exit the pseudo-non-volatile power state, memory operations associated with the memory array may remain stopped, paused, and/or aborted as shown at block 677. If it is determined that the computing system is to exit the pseudo-non-volatile power state, at block 679 power supplies associated with the memory array may be re-enabled and the computing system may be returned to the normal mode of operation shown at block 671.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
an array of memory cells coupled to an array power supply and a controller, wherein the controller is configured to cause:
a data value to be stored in at least one memory cell of the array of memory cells while the array of memory cells is operating in a first power state;
a determination to be made that a change in a power status to a computing system coupled to the array of memory cells has occurred, wherein the change in the power status of the computing system is characterized by the computing device operating in a reduced power state; and
responsive to the determination, cause the array power supply to be disabled to operate the array of memory cells in a second power state.

2. The apparatus of claim 1, wherein the second power state is characterized by a voltage applied to the array of memory cells being substantially equal to a ground reference potential.

3. The apparatus of claim 1, wherein the controller is further configured to cause the array of memory cells to be precharged prior to disabling the array power supply.

4. The apparatus of claim 1, wherein the controller is further configured to cause memory operations performed using the array of memory cells to be aborted in response to the determination that the change in status has occurred.

5. The apparatus of claim 1, wherein the controller is further configured to cause the determination that the change in status has occurred by causing a determination to be made that the computing system coupled to the array of memory cells has entered a standby state, a sleep state, or a hibernate state, or a threshold period of inactivity has occurred.

6. The apparatus of claim 1, wherein the controller is further configured to cause the stored data value to be maintained in at least one memory cell of the array of memory cells after the array power supply is disabled.

7. The apparatus of claim 1, wherein the array of memory cells comprises an array of two transistor, one capacitor (2T1C) memory cells.

8. The apparatus of claim 1, wherein the controller is further configured to cause the array of memory cells to operate in the second power state by causing the array of memory cells to be operated without performing a memory refresh operation.

9. An apparatus, comprising:
an array of memory cells comprising two transistor one capacitor (2T1C) memory cells; and
a controller coupled to the array of memory cells, wherein the controller is configured to:
provide a first amount of power to the array of memory cells when the array of memory cells are operating in a first power state;
store data values in the 2T1C memory cells;
provide a second amount of power to the array of memory cells to operate the array of memory cells in a second power state; and
maintain the data values when the array of memory cells are operating in the second power state.

10. The apparatus of claim 9, wherein the controller configured to cause a power supplied to the array of memory cells to be disabled to operate the array in the second mode of operation.

11. The apparatus of claim 9, wherein the controller is configured to cause the array to be precharged prior to causing the array to operate in the second mode of operation.

12. The apparatus of claim 9, wherein the second amount of power provided to the array of memory cells is substantially zero volts.

13. The apparatus of claim 9, wherein the controller is configured to cause the array to operate in the second power state responsive to a determination that a status corresponding to a host coupleable to the array has changed.

14. The apparatus of claim 13, wherein the 2T1C memory cells have respective source/drain regions connected to respective plates of a capacitor, and wherein the capacitor is not coupled to a cell plate power supply.

15. The apparatus of claim 9, wherein the controller is configured to not cause a memory refresh operation to be performed on the array of memory cells while the array of memory cells is operating in the second mode of operation.

16. The apparatus of claim 9, wherein the array of memory cells is a three-dimensional NAND array.

17. An apparatus, comprising:
a first transistor having a first source/drain region coupled to a first plate of a capacitor and a second source/region coupled to a first bit line;
a second transistor having a first source/drain region coupled to a second plate of the capacitor and a second source/drain region coupled to a second bit line; and
a controller coupled to the first bit line and the second bit line, wherein the controller is configured to cause:
a first voltage to be supplied to at least one of the first bit line, the second bit line, and a word line in a first mode of operation;
a data value to be stored by the capacitor when the first voltage is supplied;
a second voltage to be supplied to at least one of the first bit line, the second bit line, and the word line in a second mode of operation; and
maintain the stored data value when the second voltage is supplied.

18. The apparatus of claim 17, wherein the first bit line and the second bit line are complementary bit lines coupled to a sense amplifier, and wherein the sense amplifier is configured to store an operand for use in a logical operation.

19. The apparatus of claim 18, wherein the first voltage is higher than the second voltage.

20. The apparatus of claim 18, wherein the controller is configured to cause the first transistor and the second transistor to be precharged prior to causing the second voltage to be applied to the at least one the first bit line, the second bit line, and the word line.

21. The apparatus of claim 18, wherein a gate region of the first transistor and a gate region of the second transistor are coupled to the word line.

22. The apparatus of claim 18, wherein the capacitor is not coupled to a cell plate power supply.

23. The apparatus of claim 18, wherein the first transistor, the second transistor, and the capacitor are formed on pitch with the first bit line and the second bit line.

24. A method, comprising:
initializing an array of memory cells comprising two transistor one capacitor (2T1C) memory cells by powering up a device coupleable to the array of memory cells up;
operating the array of memory cells by providing a first amount of power to the array;
receiving an indication from the device corresponding to a change in status of the device;
responsive to receipt of the indication, disabling an array power supply to operate the array of memory cells using at least one of a second amount of power to the array or a third amount of power to the array while the device is receiving a reduced, non-zero amount of power.

25. The method of claim 24, wherein the second amount of power is less than the first amount of power but greater than the third amount of power and wherein the third amount of power is a ground reference potential.

26. The method of claim 24, further comprising maintain a data value stored in at least one memory cell of the array of memory cells while operating the array of memory cells using the second amount of power or the third amount of power.

27. The method of claim 24, further comprising precharging the array of memory cells prior to providing the second amount of power to the array or the third amount of power to the array.

28. The method of claim 24, further comprising aborting execution of memory operations prior to operating the array of memory cells by providing the at least one of the second amount of power to the array or the third amount of power to the array.

29. The method of claim 24, further comprising:
receiving a second indication from the device corresponding to a second change in status of the device;
enabling the array power supply; and
operating the array of memory cells by providing the first amount of power to the array.

* * * * *